US012027196B2

(12) United States Patent
Shibatani et al.

(10) Patent No.: US 12,027,196 B2
(45) Date of Patent: Jul. 2, 2024

(54) MEMORY SYSTEM, CONTROL METHOD, AND POWER CONTROL CIRCUIT

(71) Applicant: KIOXIA CORPORATION, Tokyo (JP)

(72) Inventors: Megumi Shibatani, Tokyo (JP);
Takashi Ooshima, Chiba Chiba (JP);
Nobuyuki Suzuki, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/856,909

(22) Filed: Jul. 1, 2022

(65) Prior Publication Data

US 2023/0008376 A1   Jan. 12, 2023

Related U.S. Application Data

(63) Continuation-in-part of application No. 17/589,563, filed on Jan. 31, 2022.

(30) Foreign Application Priority Data

Jul. 8, 2021 (JP) .................................. 2021-113533
Jun. 17, 2022 (JP) .................................. 2022-097686

(51) Int. Cl.
G11C 11/40 (2006.01)
G11C 11/4072 (2006.01)
(Continued)

(52) U.S. Cl.
CPC ...... G11C 11/4074 (2013.01); G11C 11/4072 (2013.01); G11C 11/4096 (2013.01)

(58) Field of Classification Search
CPC ........ G06F 6/06; G06F 3/0679; G06F 3/0655; G06F 3/0625; G06F 11/00; G06F 11/07;
(Continued)

(56) References Cited

U.S. PATENT DOCUMENTS 6,601,181 B1   7/2003 Thomas
7,782,498 B2 *  8/2010 Hoshi ................ H04N 1/00708
                                                   399/376
(Continued)

FOREIGN PATENT DOCUMENTS

FR   2880445 A1 *  7/2006   ............. G11C 16/30
JP   5524551 B2     6/2014
(Continued)

OTHER PUBLICATIONS

D. Pala, I. Miro-Panades and O. Sentieys, "Freezer: A Specialized NVM Backup Controller for Intermittently Powered Systems," in IEEE Transactions on Computer-Aided Design of Integrated Circuits and Systems, vol. 40, No. 8, pp. 1559-1572, Aug. 2021.*
(Continued)

Primary Examiner — Pierre Michel Bataille
(74) Attorney, Agent, or Firm — Kim & Stewart LLP

(57) ABSTRACT

A memory system includes: a first nonvolatile memory; a second volatile memory; a controller; a power control circuit configured to perform control such that a first voltage is applied to the first memory, the second memory, and the controller based on first power supplied from an external power supply; and a power storage device configured to supply second power to the power control circuit while the first power from the external power supply is interrupted. While the first power supplied from outside is interrupted, the power control circuit applies a second voltage based on the second power supplied from the power storage device to the first memory, the second memory, and the controller. The power control circuit stops the application of the second voltage to the second memory after the data is read from the second memory and before the data is written into the first memory.

20 Claims, 11 Drawing Sheets

(51) Int. Cl.
*G11C 11/4074* (2006.01)
*G11C 11/4096* (2006.01)

(58) Field of Classification Search
CPC ... G06F 3/0656; G11C 16/10; G11C 11/4072; G11C 11/4074; G11C 11/4096
See application file for complete search history.

(56) References Cited

U.S. PATENT DOCUMENTS

| | | |
|---|---|---|
| 7,911,855 B2 | 3/2011 | Tada |
| 8,190,788 B2 | 5/2012 | Mochizuki |
| 9,251,057 B2 | 2/2016 | Higo et al. |
| 9,996,278 B2 * | 6/2018 | Zettsu ............... G06F 3/0617 |
| 10,726,879 B2 | 7/2020 | Berman et al. |
| 2007/0046004 A1 * | 3/2007 | Komaki ............... B60R 21/017 307/10.1 |
| 2012/0117407 A1 * | 5/2012 | Kanai ............... G06F 1/3275 713/323 |
| 2013/0031397 A1 * | 1/2013 | Abe ............... G06F 1/3225 713/324 |
| 2014/0104970 A1 * | 4/2014 | Nakamura ............... G11C 7/22 365/194 |
| 2015/0279304 A1 * | 10/2015 | Yoneyama ............... H03K 3/012 345/98 |
| 2017/0199686 A1 * | 7/2017 | Machida ............... G06F 1/266 |
| 2017/0277464 A1 * | 9/2017 | Yoon ............... G06F 11/07 |
| 2017/0293335 A1 | 10/2017 | Dunstan et al. |
| 2018/0081414 A1 * | 3/2018 | Kojima ............... G06F 1/30 |
| 2019/0065081 A1 | 2/2019 | Takeda et al. |
| 2019/0073147 A1 * | 3/2019 | Ogawa ............... G06F 12/0802 |
| 2019/0354157 A1 | 11/2019 | Cui et al. |
| 2020/0041578 A1 * | 2/2020 | Ito ............... G06F 1/28 |
| 2020/0285299 A1 * | 9/2020 | Kubota ............... G06F 1/3246 |
| 2020/0409778 A1 * | 12/2020 | Abe ............... G06F 11/0772 |
| 2021/0074336 A1 * | 3/2021 | Kumagai ............... G11C 5/141 |
| 2021/0249856 A1 * | 8/2021 | Galin ............... H02J 3/381 |

FOREIGN PATENT DOCUMENTS

| | | | | |
|---|---|---|---|---|
| KR | 20200077168 A1 * | 6/2020 | | G06F 11/327 |
| TW | 201826079 A | 7/2018 | | |
| WO | WO-2012001917 A1 * | 1/2012 | | G06F 1/3225 |
| WO | WO-2021038393 A1 * | 3/2021 | | G06F 1/3215 |

OTHER PUBLICATIONS

N. Gonzales et al., "An Ultra Low-Power Non-Volatile Memory Design Enabled by Subquantum Conductive-Bridge RAM," 2016 IEEE 8th International Memory Workshop (IMW), Paris, France, 2016, pp. 1-4.*

H. -W. Tseng, L. Grupp and S. Swanson, "Understanding the impact of power loss on flash memory," 2011 48th ACM/EDAC/IEEE Design Automation Conference (DAC), San Diego, CA, USA, 2011, pp. 35-40.*

W. Buesser, V. Fuentes, P. Goguillot, N. Nandra, T. Roz and J. Rudin, "A Contactless Read Write Transponder using Low Power EEPROM techniques," ESSCIRC '96: Proceedings of the 22nd European Solid-State Circuits Conference, Neuchatel, Switzerland, 1996, pp. 356-359.*

* cited by examiner

FIG. 4A

| TERMINAL | STOP SEQUENCE |
|---|---|
| FIRST TERMINAL | IMMEDIATELY AFTER POWER INTERRUPTION IS DETECTED |
| SECOND TERMINAL | AFTER NOTIFICATION OF EVACUATION OF DATA TO BUFFER MEMORY HAS COMPLETED |
| THIRD TERMINAL | AFTER NOTIFICATION OF WRITE COMMAND SEQUENCE TO NAND MEMORY HAS COMPLETED |
| FOURTH TERMINAL | AFTER NOTIFICATION OF WRITING OF DATA IN NAND MEMORY HAS COMPLETED |

MEMORY SYSTEM, CONTROL METHOD, AND POWER CONTROL CIRCUIT

CROSS-REFERENCE TO RELATED APPLICATION

This application is a continuation-in part of U.S. patent application Ser. No. 17/589,563, filed Jan. 31, 2022, and is based upon and claims the benefit of priority from Japanese Patent Application No. 2021-113533, filed Jul. 8, 2021, and Japanese Patent Application No. 2022-097686, filed Jun. 17, 2022; and the entire contents of each of these applications are incorporated herein by reference.

FIELD

Embodiments described herein relate generally to a memory system, a control method, and a power control circuit.

BACKGROUND

Memory systems are connected to hosts and operate when power is supplied from external power supplies. When power supply from the external power supplies is interrupted without advance notice, it is necessary for memory systems to store data in a nonvolatile manner. Therefore, power storage devices capable of storing backup power which is an alternative to power from external power supplies are mounted on memory systems. During interruption of power supply, memory systems can store data in a nonvolatile manner using backup power.

With an increase in storage capacity of a memory system, data to be stored is increased. Therefore, an amount of necessary backup power increases. To increase the amount of backup power, it is conceivable to increase the size of a power storage device mounted on the memory system. However, to reduce cost of the memory system or miniaturize the memory system, it is desirable to decrease the size of the power storage device to be mounted.

DESCRIPTION OF THE DRAWINGS

FIG. 4A is a diagram illustrating a table used in the memory system according to the first embodiment to manage a procedure for stopping application of a voltage;

DETAILED DESCRIPTION

Embodiments provide a memory system, a control method, and a power control circuit capable of appropriately controlling power consumed in a process of processing data in a nonvolatile manner during interruption of power supply.

In general, according to one embodiment, a memory system includes: a first nonvolatile memory; a second volatile memory; a controller; a power control circuit configured to perform control such that a first voltage is applied to the first memory, the second memory, and the controller based on first power supplied from at least an external power supply; and a power storage device configured to be able to supply second power to the power control circuit while the first power from the external power supply is interrupted. While the first power supplied from the external power supply is interrupted, the power control circuit performs control such that a second voltage based on the second power supplied from the power storage device is applied to the first memory, the second memory, and the controller, the controller reads data from the second memory and the power control circuit performs control such that the application of the second voltage to the second memory is stopped after the data is read before writing of the data into the first memory has completed, and the controller transmits the data to the first memory and the power control circuit performs control such that the application of the second voltage to the first memory is stopped after the data has been written into the first memory.

Hereinafter, embodiments of the disclosure will be described.

In the present specification, a plurality of expressions are given to several elements. The expressions are merely illustrative and other expressions may be given to the elements.

The drawings are schematic, and relationships between thickness and plane dimensions, ratios of thicknesses of layers, and the like may be different from actual ones. Relationships and ratios between dimensions depicted in different drawings are different in some portions.

First Embodiment

Figure 1:
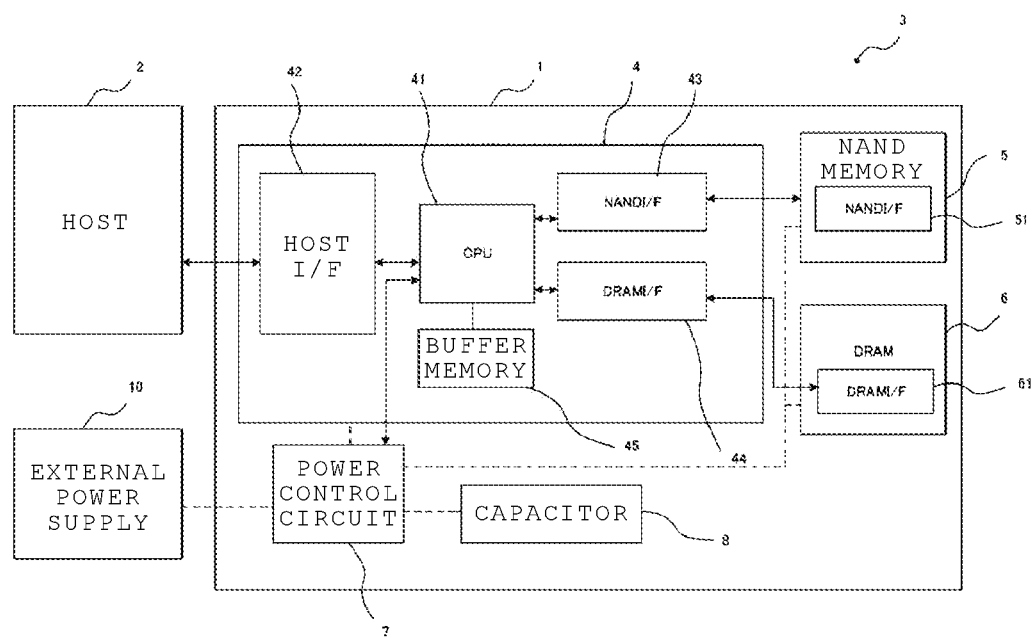
FIG. 1 is a block diagram schematically illustrating a part of a configuration of an information processing system including a memory system according to a first embodiment.

A basic configuration of an information processing system including a memory system according to a first embodiment will be described with reference to FIG. 1.

An information processing system 3 includes a memory system 1, a host 2, and an external power supply 10.

The host 2 may be a storage server which stores a large number and variety of data in the memory system 1, or may be a personal computer. A plurality of memory systems 1 may be connected to the host 2.

An external power supply 10 is a power supply provided outside the memory system 1 and is a device that supplies power to the memory system 1. The external power supply may be provided inside the host 2.

The memory system 1 is a storage device configured such that data is written into or read from a nonvolatile memory. Hereinafter, the memory system 1 which is implemented as a solid-state drive (SSD) will be described as an example. The memory system 1 may be implemented as, for example, a memory card, or a universal flash storage (UFS) device.

The memory system 1 includes a controller 4, a nonvolatile memory 5, a volatile memory 6, a power control circuit 7, and a power storage device 8.

The nonvolatile memory 5 is a semiconductor storage device that stores data in a nonvolatile manner. The nonvolatile memory 5 is an example of a first memory. The nonvolatile memory 5 is, for example, a NAND flash memory. The NAND flash memory includes a plurality of blocks. Each of the plurality of blocks includes a plurality of memory cells. The block is a data erasing unit. The block includes a plurality of pages. The page is a data reading and writing unit. Hereinafter, the nonvolatile memory 5 is referred to as the NAND memory 5.

The NAND memory 5 includes a NAND interface (NAND I/F) 51. The NAND I/F 51 is an example of a fourth circuit. The NAND I/F 51 communicates with the controller 4 by exchanging data with a NAND I/F 43 in the controller 4 to be described below.

The volatile memory 6 is a semiconductor storage device that stores data in a volatile manner. The volatile memory 6 is an example of a second memory. A dynamic RAM (DRAM) is used as the volatile memory 6. Alternatively, a static RAM (SRAM) may be used. The volatile memory 6 includes, as buffer areas, a write butter that temporarily stores data to be written into the NAND memory 5 and a read buffer that temporarily stores data read from the NAND memory 5. The volatile memory 6 further includes a cache area of a lookup table (LUT) and a storage area of system management information. The LUT stores information that maps a logical address designated for the host 2 to access the memory system 1 to a physical address of the NAND memory 5. Hereinafter, the volatile memory 6 is referred to as the DRAM 6.

The DRAM 6 includes a DRAM I/F 61. The DRAM I/F 61 communicates with the controller 4 by exchanging data with a DRAM I/F 44 in the controller 4 to be described below.

The controller 4 functions as a memory controller for the memory system 1. The controller 4 is implemented by a circuit such as a system-on-a-chip (SoC). The controller 4 can perform command processing to process various commands from the host 2.

The controller 4 performs various processes by firmware (FW) stored in a nonvolatile manner in the NAND memory 5 or a read-only memory (ROM) (not illustrated). It is noted that dedicated hardware in the controller 4 may perform some or all of the processes.

The controller 4 controls the power control circuit 7. The controller 4 communicates with the power control circuit 7 via, for example, an inter-integrated circuit (I2C) bus.

The controller 4 performs a power loss protection (PLP) process. The PLP process is a process of writing data to be stored into the NAND memory 5 and storing the data in a nonvolatile manner using charges of the power storage device 8 when power supplied to the memory system 1 is interrupted.

The controller 4 includes a central processing unit (CPU) 41, a host interface (host I/F) 42, the NAND interface (NAND I/F) 43, the DRAM interface (DRAM I/F) 44, and a buffer memory 45. The CPU 41, the host I/F 42, the NAND I/F 43, the DRAM I/F 44, and the buffer memory 45 may be connected to each other via a bus.

The CPU 41 implements various functions by executing FW stored in the NAND memory 5 or the like.

The host I/F 42 includes a circuit that performs communication control with the host 2 and receives a command. The host I/F 42 is an example of a first circuit. The memory system 1 is connected to the host 2 via the host I/F 42. The host I/F 42 receives various commands, for example, an I/O command, from the host 2. The I/O command includes a write command and a read command. The host I/F 42 conforms with, for example, an interface standard such as a PCI Express (PCIe)® or an NVM Express (NVMe)®.

The NAND I/F 43 includes a circuit that transmits and receives a command or data between the controller 4 and the NAND memory 5. The NAND I/F 43 is an example of a second circuit. The NAND I/F 43 electrically connects the controller 4 to the NAND memory 5. The NAND I/F 43 conforms with an interface standard such as Toggle DDR or open NAND flash interface (ONFI).

The DRAM I/F 44 includes a circuit that transmits and receives a command or data to and from the DRAM 6. The DRAM I/F 44 is an example of a third circuit. The DRAM I/F 44 electrically connects the controller 4 to the DRAM 6.

The buffer memory 45 is a semiconductor storage device that stores data in a volatile manner. As the buffer memory 45, an SRAM is used. Alternatively, a DRAM may be used.

The CPU 41 temporarily stores data which is received from the host 2 and is to be written into the NAND memory 5 in a write buffer of the DRAM 6. The CPU 41 stores the data temporarily stored in the write buffer of the DRAM 6 in the buffer memory 45. The CPU 41 writes the data stored in the buffer memory 45 into the NAND memory 5.

The write buffer of the buffer memory 45 and the DRAM 6 temporarily store data supplied from the host 2 until the data is written into the NAND memory 5. That is, the write buffer of the buffer memory 45 and the DRAM 6 store data during writing in the NAND memory 5. The buffer memory 45 and the DRAM 6 are volatile memories. Therefore, data during the writing is lost when power supplied to the memory system 1 is interrupted.

The data stored from the write buffer of the DRAM 6 to the buffer memory 45 is, for example, data corresponding to one page. Here, the CPU 41 can write data of the buffer memory 45 in the NAND memory 5 collectively.

The power control circuit 7 supplies power to each semiconductor component such as the controller 4, the DRAM 6, and the NAND memory 5 mounted on the memory system 1 via a plurality of power circuits. The power control circuit 7 is, for example, power management integrated circuit (PMIC). The power control circuit 7 performs control of a starting sequence of each power circuit, ON/OFF control of each power circuit, and the like automatically in response to certain events or in response to instructions from the controller 4. The details will be described below.

The power storage device 8 includes one or more electronic components. The power storage device 8 is, for example, a capacitor. The capacitor is an electronic component capable of charging and discharging charges. As the capacitor, a stacked ceramic capacitor, an aluminum electrolytic capacitor, a functional polymer capacitor, or the like is used. The power storage device may be a battery.

The memory system 1 according to the embodiment interrupts supply of power to a circuit irrelevant to nonvolatile processing of data in the PLP process. Thus, the memory system 1 according to the embodiment can reduce power necessary for nonvolatile processing.

Figure 2:
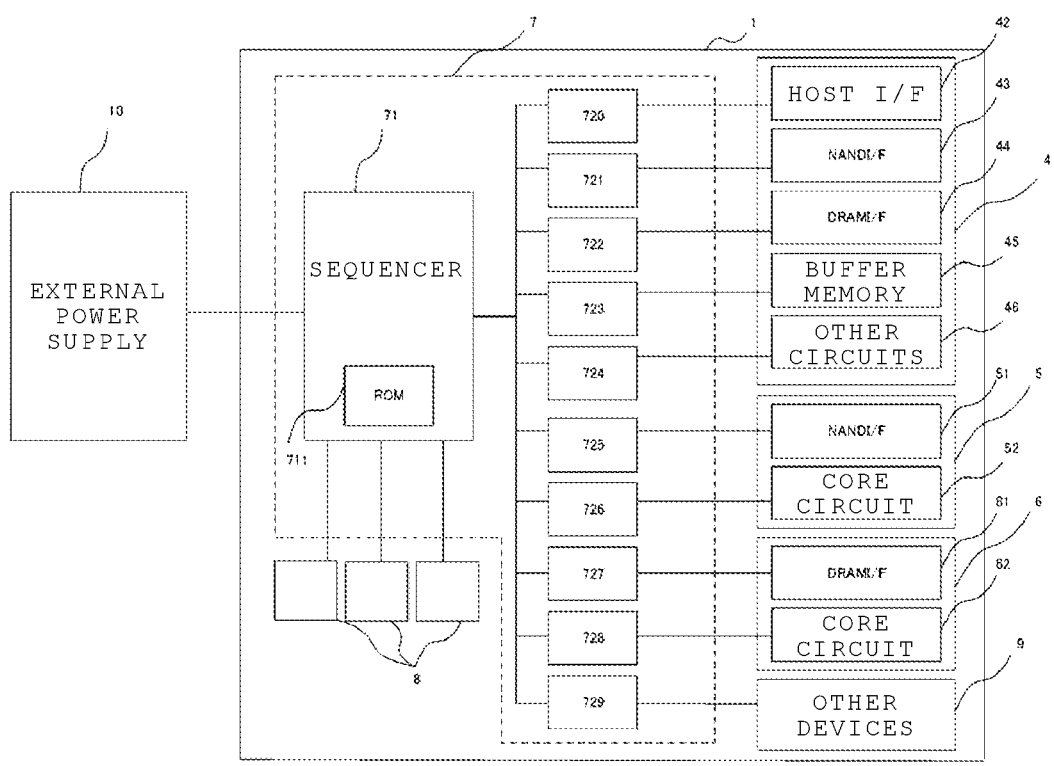
FIG. 2 is a block diagram illustrating a power supply configuration of the memory system according to the first embodiment.

FIG. 2 is a block diagram illustrating a power supply configuration of the memory system 1 according to the embodiment. Power is supplied from the external power supply 10 to the power control circuit 7. The power control circuit 7 supplies power to the power storage device 8, the controller 4, the NAND memory 5, the DRAM 6, and other devices 9. The plurality of power storage devices 8 are connected to the power control circuit 7. The other devices 9 are elements (for example, a clock oscillator and a temperature sensor) of the memory system 1 in addition to the elements illustrated in FIG. 1.

The power control circuit 7 includes a sequencer 71, a plurality of power circuits 720 to 729, a nonvolatile memory 711, and a voltage monitoring terminal (not illustrated). The nonvolatile memory 711 is, for example, a NOR flash memory. Hereinafter, the nonvolatile memory 711 is referred to as a ROM 711.

The power circuits 720 to 729 are converters that convert input voltages into other voltages. The power circuits 720 to 729 are, for example, direct current/direct current converters (DC/DC converters) or low drop out regulators (LDO regulators). It is noted that the power circuits 720 to 729 may be provided outside the power control circuit 7. Here, the power control circuit 7 and the power circuits 720 to 729 are connected via terminals.

The voltage monitoring terminal is a terminal that monitors whether power is supplied from the external power supply 10 to the power control circuit 7.

The controller 4 includes the host I/F 42, the NAND I/F 43, the DRAM I/F 44, the buffer memory 45, and other circuits 46. The other circuits 46 include circuits that communicate with the CPU 41 and the power control circuit 7. The host I/F 42, the NAND I/F 43, the DRAM I/F 44, the buffer memory 45, and the other circuits 46 are independently connected to the power control circuit 7, so that a voltage is separately applied or the application of the voltage is separately stopped by turning on and off the power circuits 720 to 724.

A voltage is applied from the power control circuit 7 to the host I/F 42 via the power circuit 720. A voltage is applied from the power control circuit 7 to the NAND I/F 43 via the power circuit 721. A voltage is applied from the power control circuit 7 to the DRAM I/F 44 via the power circuit 722. A voltage is applied from the power control circuit 7 to the buffer memory 45 via the power circuit 723. A voltage is applied from the power control circuit 7 to the other circuits 46 via the power circuit 724.

The NAND memory 5 includes a NAND I/F 51 and a core circuit 52. The core circuit 52 includes a memory cell and a circuit controlling a voltage to be applied to the memory cell. The NAND I/F 51 and the core circuit 52 are independently connected to the power control circuit 7, so that a voltage is separately applied or the application of the voltage is separately stopped by turning on and off the power circuits 725 and 726.

A voltage is applied from the power control circuit 7 to the NAND I/F 51 via the power circuit 725. A voltage is applied from the power control circuit 7 to the core circuit 52 via the power circuit 726.

The DRAM 6 includes the DRAM I/F 61 and a core circuit 62. The core circuit 62 includes a buffer area or a memory cell used as a storage area for system management information and a circuit that controls a voltage applied to the memory cell. The DRAM I/F 61 and the core circuit 62 are independently connected to the power control circuit 7, so that a voltage is separately applied or the application of the voltage is separately stopped by turning on and off the power circuits 727 and 728.

A voltage is applied from the power control circuit 7 to the DRAM I/F 61 via the power circuit 727. A voltage is applied from the power control circuit 7 to the core circuit 62 via the power circuit 728.

A voltage is applied from the power control circuit 7 to the other devices 9 via the power circuit 729.

The sequencer 71 of the power control circuit 7 controls a power sequence by executing a sequence code. The sequence code is stored in the ROM 711 before shipping of the memory system 1. The sequencer 71 controls a starting sequence of each of the power circuits 720 to 729 when the memory system 1 starts. The sequencer 71 detects interruption of supply of power from the external power supply 10 by monitoring a voltage of the voltage monitoring terminal. The sequencer 71 performs power control such as control of ON/OFF of each of the power circuits 720 to 729. The sequencer 71 can independently control ON/OFF of each of the power circuits 720 to 729.

The sequencer 71 also controls charging and discharging of the power storage device 8. When power is supplied from the external power supply 10 to the power control circuit 7, the sequencer 71 charges the power storage device 8 using power supplied from the external power supply 10.

The power control circuit 7 uses the external power supply 10 connected to the memory system 1 to apply a voltage to each semiconductor component of the memory system 1. A voltage based on the power output from the external power supply 10 is applied to the power control circuit 7 via a connector (not illustrated). The voltage based on the power output from the external power supply 10 is, for example, 12 V. When the power is supplied from the external power supply 10, the sequencer 71 supplies the power of the external power supply 10 to each of the power circuits 720 to 729.

Conversely, when the power from the external power supply 10 to the power control circuit 7 is interrupted, the sequencer 71 supplies power of the power storage device 8 to each of the power circuits 720 to 729 using the power storage device 8 as a backup power supply. That is, the sequencer 71 can switch between the external power supply 10 and the power storage device 8 for supplying the power to each of the power circuits 720 to 729.

The power circuits 720 to 729 use the supplied power to generate a plurality of voltages necessary for the semiconductor components of the memory system 1 and apply the plurality of generated voltages to the semiconductor components. The plurality of voltages applied to the semiconductor components are, for example, 0.8 V or 3.3 V.

The power supplied from the external power supply 10 is an example of first power and the voltage supplied to each semiconductor component based on the first power is an example of a first voltage. The power supplied from the power storage device 8 is an example of second power and a voltage supplied to each semiconductor component based on the second power is an example of a second voltage.

The sequencer 71 of the power control circuit 7 detects interruption of the power supplied to the memory system 1 by monitoring a voltage of the voltage monitoring terminal. The sequencer 71 compares the voltage based on the power output from the external power supply with a threshold voltage. When it is detected that the voltage based on the power output from the external power supply is equal to or less than the threshold voltage, the sequencer 71 determines that the power supplied to the memory system 1 is interrupted. The sequencer 71 uses the charges with which the power storage device 8 is charged to apply the voltage to each semiconductor component of the memory system 1. As such, the PLP process is performed.

Figure 3:
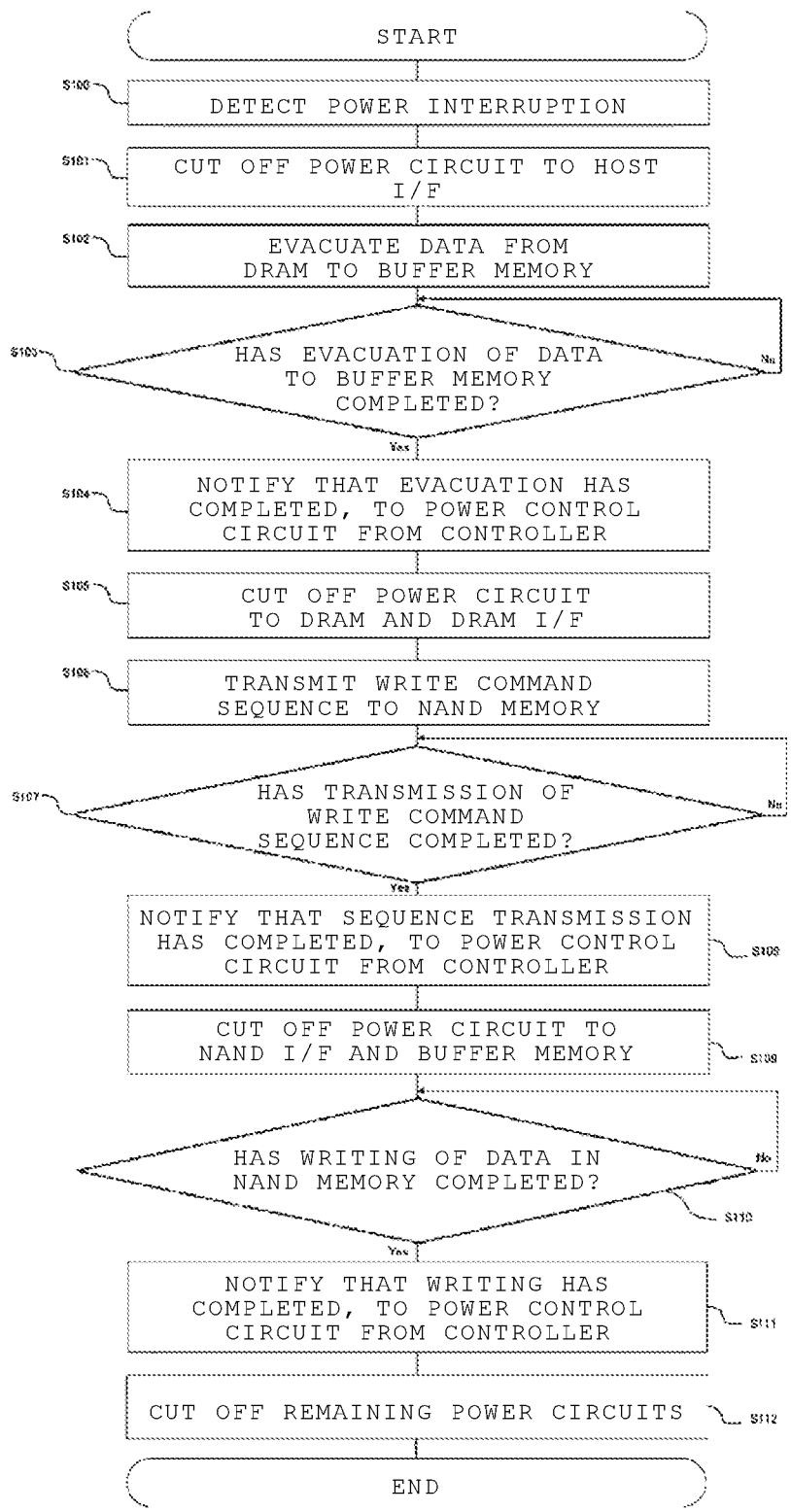
FIG. 3 is a flowchart illustrating power control in a power loss protection (PLP) process in the memory system according to the first embodiment.

FIG. 3 is a flowchart illustrating power control in a PLP process in the memory system according to the embodiment.

As illustrated in FIG. 3, when the power control circuit 7 detects the interruption of the power supplied from the external power supply 10 (S100), the power control circuit 7 turns off the power circuit 720 and stops applying the voltage to the host I/F 42 of the controller 4 (S101). Thus, the host I/F 42 controlling communication with the host 2 stops the operation.

The controller 4 evacuates data from the DRAM 6 to the buffer memory 45 (S102). The data includes data which is being written from the host 2 into the NAND memory 5. The data may include an LUT or system management information.

The controller 4 determines whether the evacuation of the data has completed (S103).

When the evacuation of the data has not completed (No in S103), the process of the controller 4 returns to S103.

When the evacuation of the data has completed (Yes in S103), the controller 4 notifies the power control circuit 7 that the evacuation of the data has completed (S104).

The power control circuit 7 which is notified of the completion turns off the power circuits 727 and 728 and stops applying the voltage to the DRAM I/F 61 and the core circuit 62 of the DRAM 6 (S105). Here, the power control circuit 7 also turns off the power circuit 722 and stops applying the voltage to the DRAM I/F 44 of the controller 4. Thus, the DRAM 6 and the DRAM I/F 44 controlling the communication with the DRAM 6 stop the operation.

Subsequently, the controller 4 transmits a write command sequence to the NAND memory 5 to write the data, which is in the buffer memory 45, into the NAND memory 5 (S106). The write command sequence includes a write command and data to be written to the NAND memory 5. The write command is transmitted from the controller 4 to the NAND memory 5. The data to be written is transmitted from the buffer memory 45 to the NAND memory 5. The write command sequence may include an address for data to be written to the NAND memory 5.

The controller 4 determines whether the transmission of the write command sequence has completed (S107).

When the transmission of the write command sequence has not completed (No in S107), the process returns to S107.

When the transmission of the write command sequence has completed (Yes in S107), the controller 4 notifies the power control circuit 7 that the transmission of the write command sequence has completed (S108).

The power control circuit 7 turns off the power circuits 721, 723, and 725 and stops applying the voltage to each of the NAND I/F 43 and the buffer memory 45 of the controller 4 and the NAND I/F 51 of the NAND memory 5 (S109).

The NAND memory 5 receives the write command sequence from the controller 4 and then writes data. The power circuit 725 applying the voltage to the NAND I/F 51 of the NAND memory 5 can be stopped earlier than the power circuit 726 applying the voltage to the circuit (the core circuit 52) that performs writing, because the time necessary for the NAND memory 5 to receive the write command sequence is shorter than a time necessary to write the data. Accordingly, by stopping applying the voltage to the NAND I/F 51 earlier than the application of the voltage to the core circuit 52, power consumption can be reduced even further.

The controller 4 determines whether the writing of the data into the NAND memory 5 has completed (S110).

When the writing of the data has not completed (No in S110), the process of the controller 4 returns to S110.

When the writing of the data has completed (Yes in S110), the controller 4 notifies the power control circuit 7 that the writing of data has completed (S111).

The power control circuit 7 turns off the remaining power circuits 724, 726, and 729 which are not turned off (S112) and the memory system 1 ends the PLP process.

FIG. 4A is a table used to manage a procedure in the power control circuit 7 for stopping the application of the voltage. The procedure in which the power control circuit 7 stops the application of the voltage may be stored as a table 7111 in FIG. 4A in the ROM 711. The power control circuit 7 (more specifically, the sequencer 71) turns off the power circuits 720 to 729 with reference to the table 7111 in the ROM 711 in response to notification from the controller 4 or detection of the interruption of the power supply from the external power supply 10.

Figure 4B:
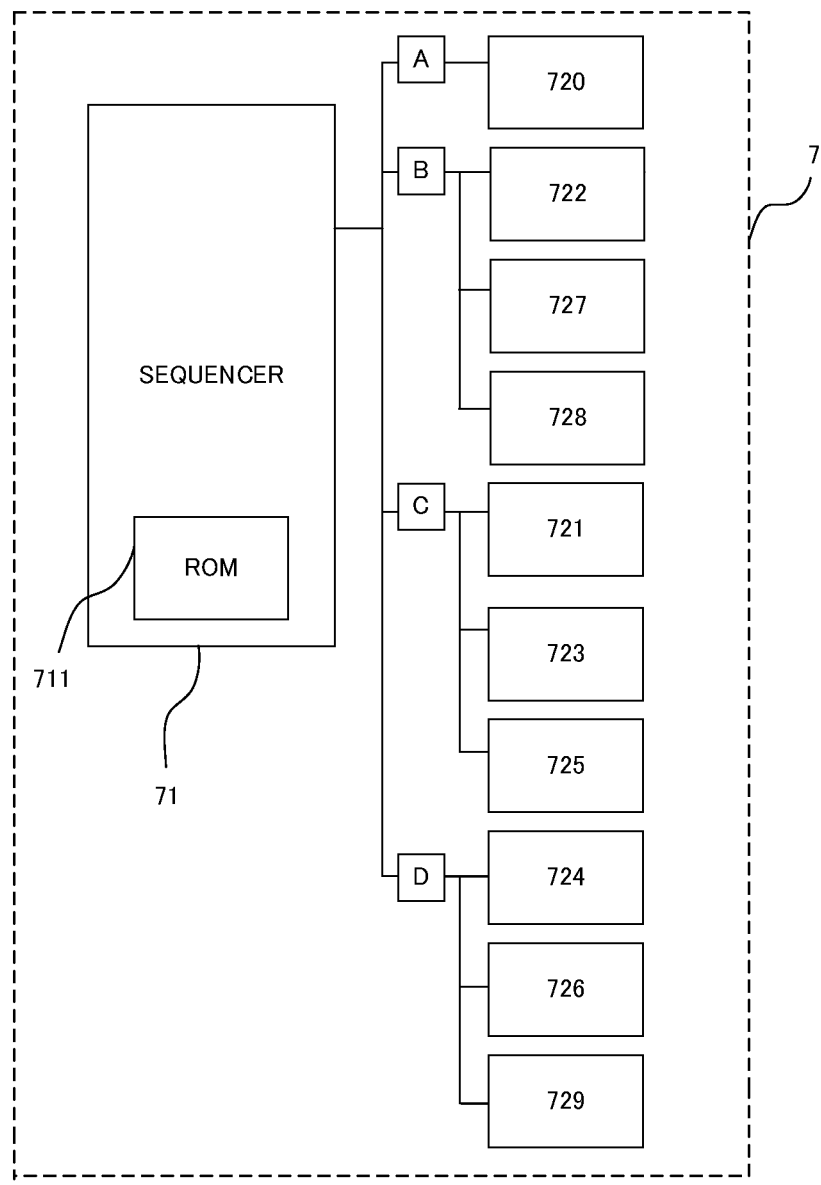
FIG. 4B is a block diagram illustrating a connection between a plurality of terminals and a plurality of power circuits according to the first embodiment.

As illustrated in FIG. 4B, the power control circuit 7 includes terminals connected to the power circuits 720 to 729. One terminal connects the sequencer 71 to one or more power circuits among the power circuits 720 to 729. For example, the power control circuit 7 includes first terminal A, second terminal B, third terminal C, and fourth terminal D. When the power circuits 720 to 729 are provided inside the power control circuit 7, the terminals are internal terminals. When the power circuits 720 to 729 are provided outside the power control circuit 7, the terminals are external terminals.

The first terminal A is connected to the power circuit 720 and the sequencer 71 turns on and off the power circuit 720 via the first terminal A.

The second terminal B is connected to the power circuits 722, 727, and 728 and the sequencer 71 turns on and off the power circuits 722, 727, and 728 via the second terminal B.

The third terminal C is connected to the power circuits 721, 723, and 725 and the sequencer 71 turns on and off the power circuits 721, 723, and 725 via the third terminal C.

The fourth terminal D is connected to the power circuits 724, 726, and 729 and the sequencer 71 turns on and off the power circuits 724, 726, and 729 via the fourth terminal D.

When the power control circuit 7 (more specifically, the sequencer 71) detects interruption of the power supplied from the external power supply 10, the power control circuit 7 refers to the table 7111. The power control circuit 7 turns off the power circuit 720 via the first terminal A without waiting for notification from the controller 4 to stop applying the voltage to the host I/F 42.

When the controller 4 notifies the power control circuit 7 that evacuation of the data from the DRAM 6 to the buffer memory 45 has completed, the power control circuit 7 refers to the table 7111. The power control circuit 7 turns off the power circuits 722, 727, and 728 via the second terminal B to stop applying the voltage to the DRAM I/F 44 of the controller 4, and the DRAM I/F 61 and the core circuit 62 of the DRAM 6.

When the controller 4 notifies the power control circuit 7 that the transmission of the write command sequence from the controller 4 to the NAND memory 5 has completed, the power control circuit 7 refers to the table 7111. The power control circuit 7 turns off the power circuits 721, 723, and 725 via the third terminal C to stop applying the voltage to the NAND I/F 43 and the buffer memory 45 of the controller 4 and the NAND I/F 51 of the NAND memory 5.

When the controller 4 notifies the power control circuit 7 that the writing of the data into the NAND memory 5 has completed, the power control circuit 7 refers to the table 7111. The power control circuit 7 turns off the power circuits 724, 726, and 729 via the fourth terminal D to stop applying the voltage to the other circuits 46 of the controller 4, the core circuit 52 of the NAND memory 5, and the other devices 9 of the memory system 1.

Figure 5:
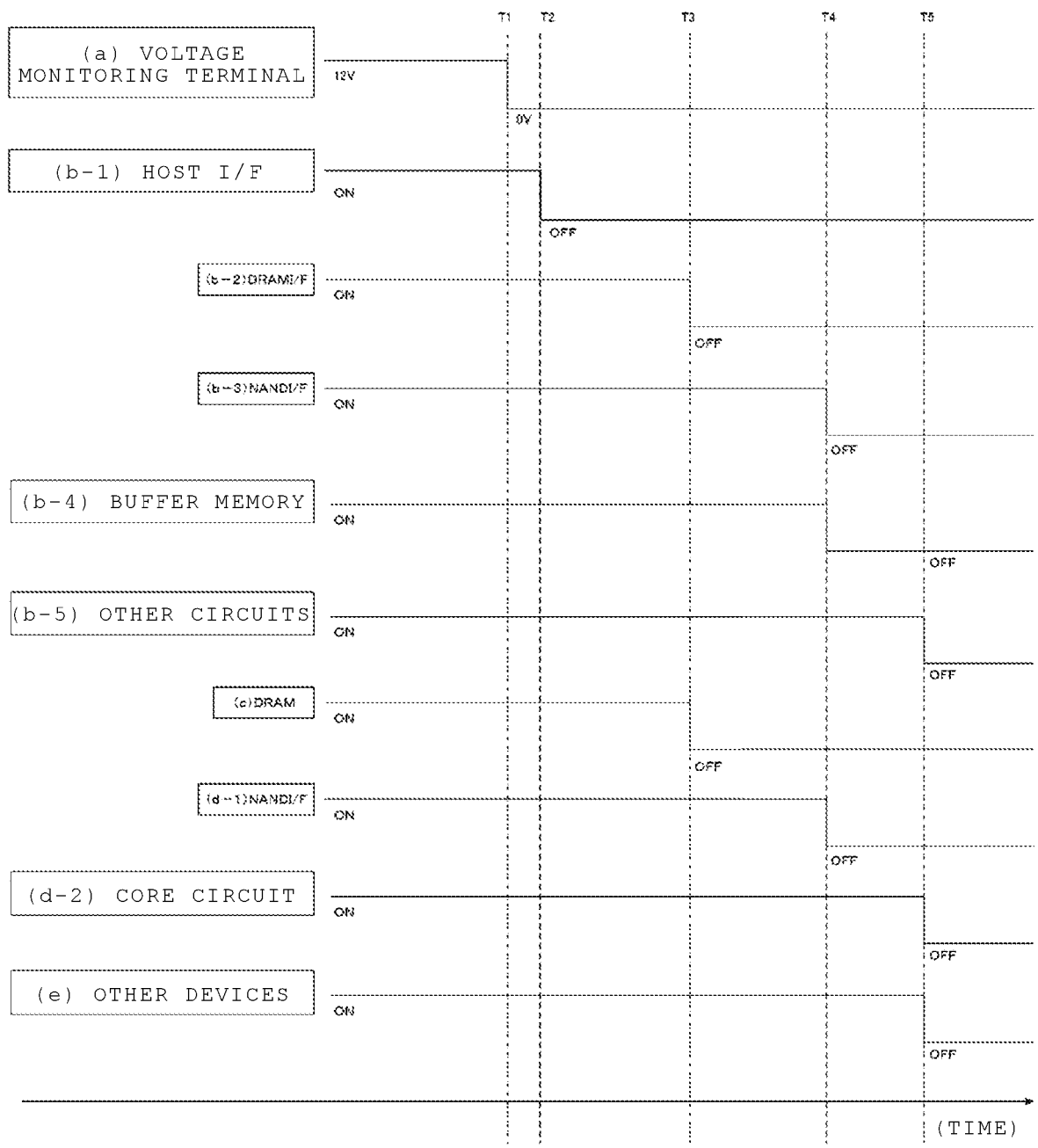
FIG. 5 is a timing chart illustrating power control in the PLP process in the memory system according to the first embodiment.

FIG. 5 is a timing chart illustrating an example of power control in the PLP process by the memory system according to the embodiment.

FIG. 5 (*a*) represents a voltage applied from the external power supply 10, (b-1) to (b-5) represent the controller 4, (c) represents the DRAM 6 (the DRAM I/F 61 and the core circuit 62), (d-1) and (d-2) represent the NAND memory 5, and (e) indicates the ON/OFF state of each power of the other devices 9.

FIG. 5 (b-1) represents the host I/F 42 of the controller 4, (b-2) represents the DRAM I/F 44 of the controller 4, (b-3) represents the NAND I/F 43 of the controller 4, (b-4) represents the buffer memory 45 of the controller 4, and (b-5) represents the ON/OFF state of each power of the other circuits 46 of the controller 4. (d-1) represents the NAND I/F 51 of the NAND memory 5 and (d-2) represents the ON/OFF state of each power of the core circuit 52 of the NAND memory 5.

As shown in (a), when the power supplied from the external power supply 10 is interrupted, the voltage applied to the voltage monitoring terminal drops from 12 V to 0 V. Thus, the power control circuit 7 detects the interruption of the power supplied from the external power supply 10 (T1).

As shown in (b-1), the power control circuit 7 turns off the power circuit 720 applying the voltage to the host I/F 42 (T2).

Subsequently, the controller 4 evacuates the data from the DRAM 6 to the buffer memory 45. When the evacuation of the data has completed, as shown in (b-2) and (c), the power control circuit 7 turns off the power circuit 722 applying the voltage to the DRAM I/F 44 and the power circuits 727 and 728 applying the voltage to the DRAM 6 (T3).

Subsequently, the controller 4 transmits the write command sequence via the NAND memory 5 to write the data, which is in the buffer memory 45, into the NAND memory 5. When the transmission of the write command sequence has completed, as shown in (b-3), (b-4), and (d-1), the power control circuit 7 turns off the power circuits 721 and 723 applying the voltage to the NAND I/F 43 and the buffer memory 45 of the controller 4 and the power circuit 725 applying the voltage to the NAND I/F 51 of the NAND memory 5 (T4).

The NAND memory 5 writes the data. When the writing of the data has completed, as shown in (b-5), (d-2), and (e), the power control circuit 7 turns off the other circuits 46 of the controller 4, the core circuit 52 of the NAND memory 5, and the power circuits 724, 726, and 729 applying the voltage to each of the other devices 9 of the memory system 1 (T5). That is, after the PLP process has completed, all the power circuits 720 to 729 are turned off. As such, the PLP process of the memory system 1 ends.

The memory system 1 according to the embodiment turns off any of the power circuits 720 to 729 applying the voltages to the circuits irrelevant to the nonvolatile processing of the data step by step in the PLP process. Thus, it is possible to reduce power consumption of the power in the PLP process. By reducing the power consumption in the PLP process, it is also possible to reduce the size of the power storage devices 8 to be mounted.

Second Embodiment

Next, a memory system 1*a* according to a second embodiment will be described. The memory system 1*a* according to the second embodiment includes a plurality of DRAMs. The plurality of DRAMs are examples of a plurality of volatile memories.

Figure 6:
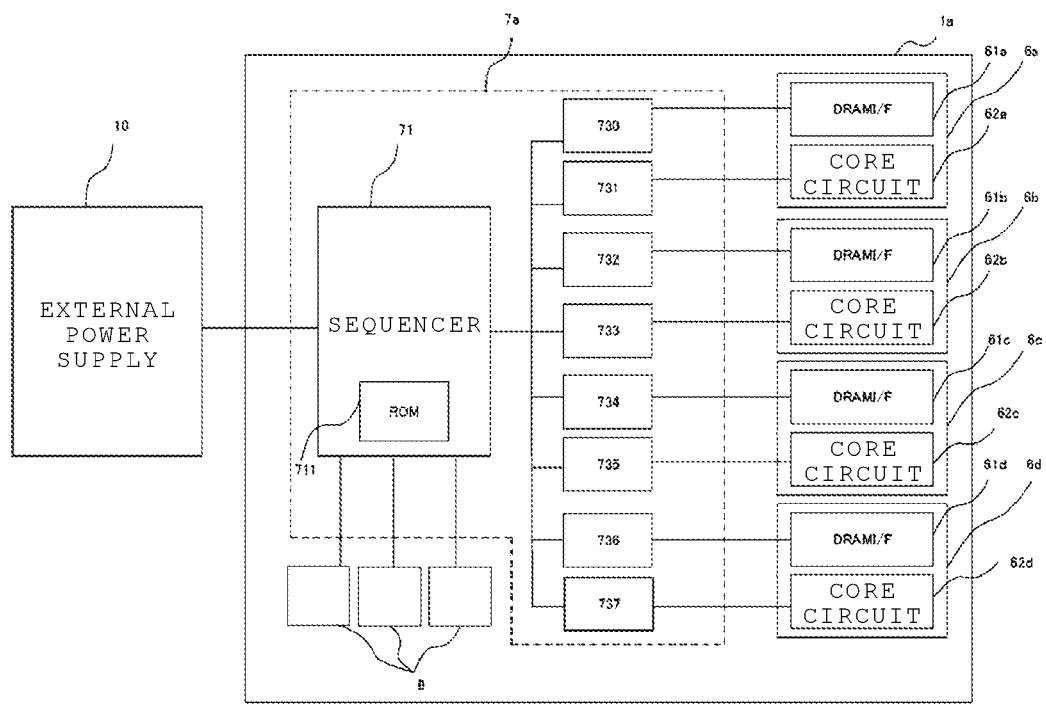
FIG. 6 is a block diagram illustrating a power supply configuration of a memory system according to a second embodiment.

FIG. 6 is a diagram illustrating a power configuration of the memory system 1*a* according to the embodiment. The same reference numerals as those of the units of the memory system 1 according to the first embodiment are given to the units of the memory system 1*a* according to the second embodiment. The controller 4, the NAND memory 5, the other devices 9, and the power circuits 720 to 726 and 729 among the elements of the memory system 1*a* are the same as those of the memory system 1 and are not illustrated.

The difference between the memory system 1*a* according to the second embodiment and the memory system according to the first embodiment is that the memory system 1*a* includes a plurality of DRAMs 6*a*, 6*b*, 6*c*, and 6*d* and data stored in the plurality of DRAMs 6*a*, 6*b*, 6*c*, and 6*d* is copied into the one DRAM 6*a* in the PLP process. The plurality of DRAMs 6*a*, 6*b*, 6*c*, and 6*d* are in different packages. The DRAMs 6*a*, 6*b*, 6*c*, and 6*d* respectively include DRAM I/Fs 61*a*, 61*b*, 61*c*, and 61*d* and core circuits 62*a*, 62*b*, 62*c*, and 62*d*.

The power control circuit 7*a* includes the sequencer 71, a plurality of power circuits 730 to 737, a nonvolatile memory 711, and a power monitoring terminal (not illustrated). The nonvolatile memory 711 is, for example, a ROM or a NOR flash memory.

The power circuits 730 to 737 are converters that convert input voltages into other voltages. The power circuits 730 to 737 are, for example, DC/DC converters or LDO regulators. It is noted that the power circuits 730 to 737 may be provided outside the power control circuit 7*a*. Here, the power control circuit 7*a* and the power circuits 730 to 737 are connected via terminals.

A voltage is applied from the power control circuit 7*a* to the DRAM I/F 61*a* via the power circuit 730. A voltage is applied from the power control circuit 7*a* to the core circuit 62*a* via the power circuit 731. A voltage is applied from the power control circuit 7*a* to the DRAM I/F 61*b* via the power circuit 732. A voltage is applied from the power control circuit 7*a* to the core circuit 62*b* via the power circuit 733. A voltage is applied from the power control circuit 7*a* to the DRAM I/F 61*c* via the power circuit 734. A voltage is applied from the power control circuit 7*a* to the core circuit 62*c* via the power circuit 735. A voltage is applied from the power control circuit 7*a* to the DRAM I/F 61*d* via the power circuit 736. A voltage is applied from the power control circuit 7*a* to the core circuit 62*d* via the power circuit 737.

The controller 4 can access the plurality of DRAMs 6*a*, 6*b*, 6*c*, and 6*d* in parallel.

Figure 7:
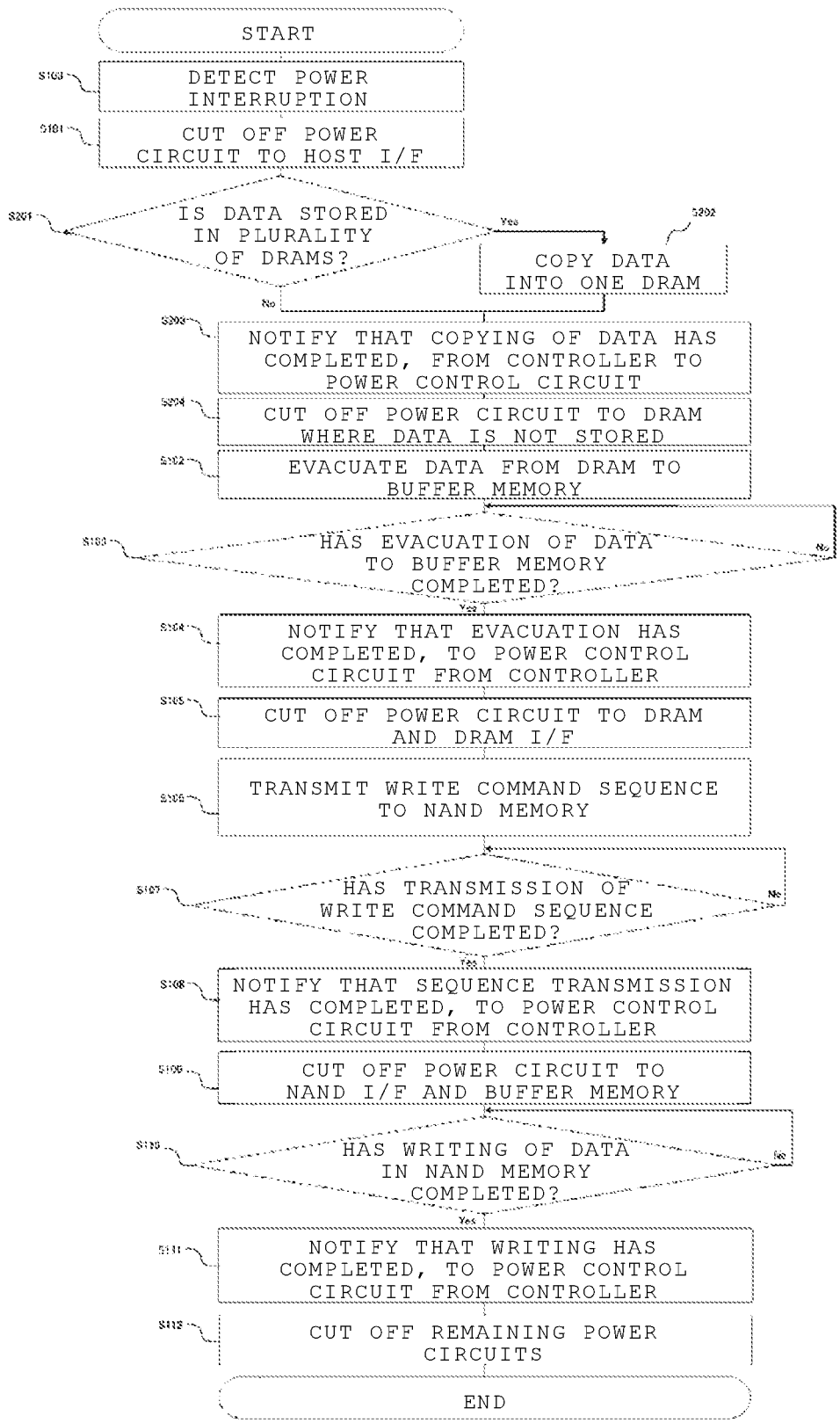
FIG. 7 is a flowchart illustrating power control in a power loss protection (PLP) process in the memory system according to the second embodiment.

FIG. 7 is a flowchart illustrating power control in a PLP process in the memory system according to the second embodiment. Here, differences from the first embodiment will be described and description of common processes will not be described or will be simplified. Processes common to those of the first embodiment are denoted by the same reference numerals.

The power control circuit 7*a* detects interruption of power supplied from the external power supply 10 (S100), and the power control circuit 7*a* turns off the power circuit 720 and stops applying the voltage to the host I/F 42 (S101).

Subsequently, the controller 4 determines whether data is stored in a nonvolatile manner in the plurality of DRAMs 6a, 6b, 6c, and 6d (S201). The data includes data which is being written from the host 2 into the NAND memory 5. The data may include an LUT or system management information.

When the data is stored in the plurality of DRAMs 6a, 6b, 6c, and 6d (Yes in S201), the controller 4 copies the data from the plurality of DRAMs 6a, 6b, 6c, and 6d into the one DRAM 6a (S202).

The controller 4 notifies the power control circuit 7a that the copying of the data has completed (S203).

Conversely, when the data is not stored in the plurality of DRAMs 6b, 6c, and 6d, that is, the data is stored in only the one DRAM 6a (No in S201), it is not necessary for the controller 4 to copy the data.

Subsequently, the power control circuit 7a turns off the power circuits 732 to 737 and stops applying the voltages to the DRAMs 6b, 6c, and 6d in which data is not stored (S204).

The controller 4 evacuates data from the DRAM 6a to the buffer memory 45 (S102).

The subsequent processes (S103 to S112) are similar to those of the first embodiment. It is noted that before the copying of the data from the plurality of DRAMs 6b, 6c, and 6d into the one DRAM 6a (S202) has completed, the write command sequence may be transmitted from the controller 4 to the NAND memory 5 (S106).

When the supply of the power to the DRAMs 6b, 6c, and 6d is stopped, the number of DRAMs which the controller 4 can access in parallel is reduced. Therefore, a transmission rate between the controller 4 and all of the DRAMs 6 including the DRAMs 6a, 6b, 6c, and 6d is reduced. In general, a transmission rate between the NAND memory 5 and the DRAM 6 via the controller 4 is about 1/100 of a transmission rate between the DRAM 6 and the controller 4. That is, the transmission rate between the NAND memory 5 and the controller 4 is slower than the transmission rate between the DRAM 6 and the controller 4.

Therefore, in the PLP process, a time taken to process data in a nonvolatile manner is limited to a transmission rate between the NAND memory 5 and the controller 4. Accordingly, a speed at which data is processed in a nonvolatile manner may be allowed as long as the speed is a speed faster than at least a transmission rate between the NAND memory 5 and the controller 4 despite a decrease in a transmission rate between the DRAM 6 and the controller 4. For example, despite a decrease in the transmission rate between the DRAM 6 and the controller 4 to 1/4, the transmission rate between the DRAM 6 and the controller 4 is sufficiently faster than the transmission rate between the NAND memory 5 and the controller 4. Therefore, even when power supplied to the DRAM 6 is reduced and the transmission rate is decreased, a rate at which data is processed in a nonvolatile manner is not slowed.

According to the above embodiment, it is possible to reduce an amount of power consumed by the memory system 1a in the PLP process. By reducing the power consumption in the PLP process, it is also possible to reduce the size of the power storage devices 8 to be mounted.

Next, a memory system 1b according to a third embodiment will be described. The memory system 1b according to the third embodiment includes a data evacuating circuit 47. The data evacuating circuit 47 is example of a sixth circuit.

Figure 8:
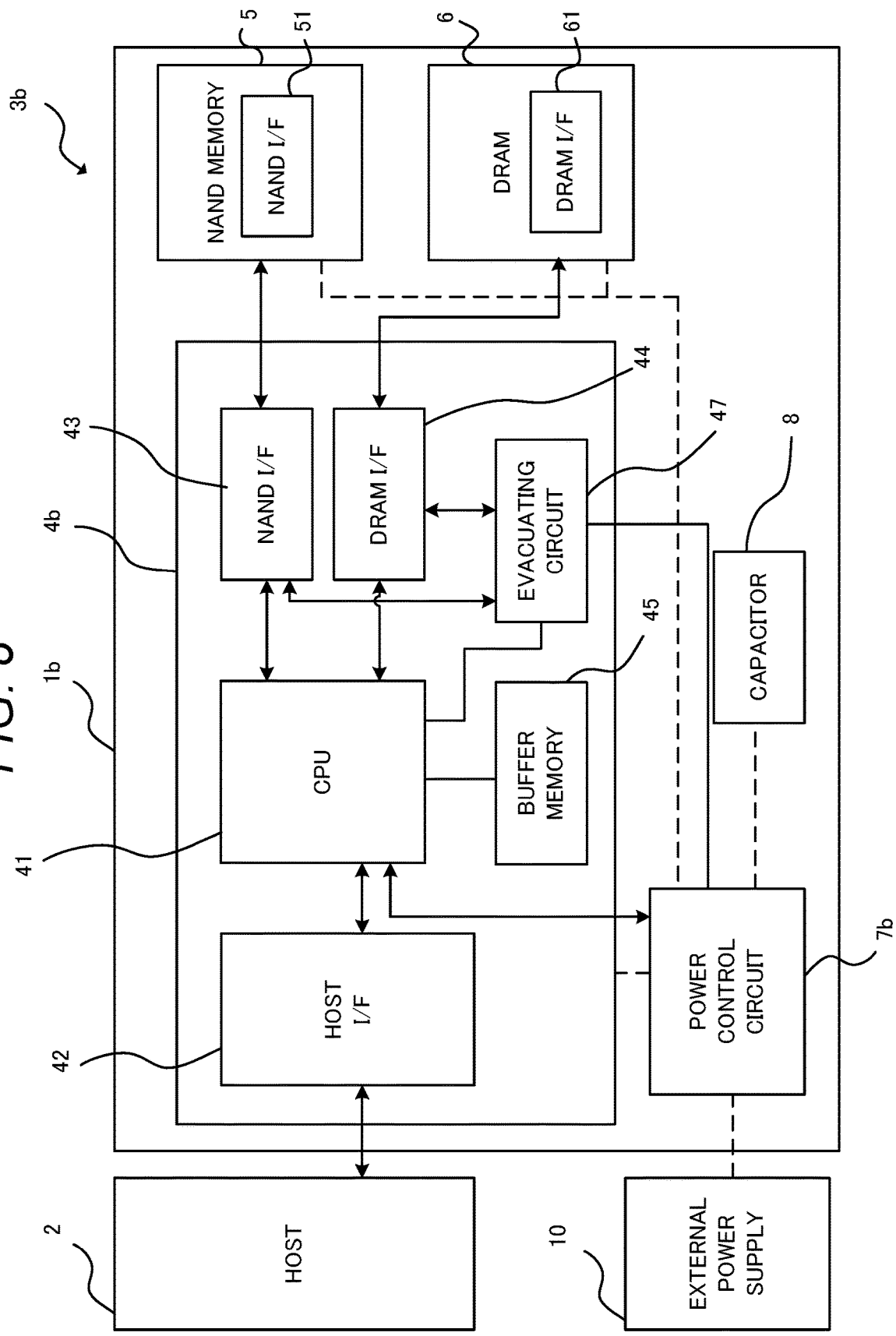
FIG. 8 is a block diagram schematically illustrating a part of a configuration of an information processing system including a memory system according to a third embodiment.

FIG. 8 is a block diagram schematically illustrating a part of an information processing system 3b including the memory system 1b according to the third embodiment. The same reference numerals as those of the units of the memory system 1 according to the first embodiment are given to the units of the memory system 1b according to the third embodiment. The host 2, the NAND memory 5, the DRAM 6, the power storage devices 8, and the external power supply 10 are the same as those of the unit of the memory system 1 of the first embodiment and will not be described.

The third embodiment is different from the first embodiment in the point of a controller 4b having the data evacuating circuit 47 and the data evacuating circuit 47 evacuating data stored in the DRAM 6 to one of evacuation areas of the NAND memory 5 when the PLP process is performed. Further, the third embodiment is different from the first embodiment in the point of voltage being stopped to be applied to the CPU 41 before evacuation of the data from the DRAM 6 to the buffer memory 45 has completed when the PLP process is performed.

The controller 4b includes the CPU 41, the host I/F 42, the NAND I/F 43, the DRAM I/F 44, and the buffer memory 45, and the data evacuating circuit 47. The CPU 41, the host I/F 42, the NAND I/F 43, the DRAM I/F 44, the buffer memory 45, and the data evacuating circuit 47 may be connected to each other via a bus. The CPU 41, the host I/F 42, the NAND I/F 43, the DRAM I/F 44, and the buffer memory 45 among the elements of the controller 4b are the same as those of the unit of the first embodiment and will not be described.

The data evacuating circuit 47 is connected to the CPU 41 and a power control circuit 7b. The data evacuating circuit 47 is a circuit operable to evacuate data. Power consumption of the data evacuating circuit 47 is less than power consumption of the CPU 41. A circuit size of the data evacuating circuit 47 is less than a circuit size of the CPU 41. For example, the data evacuating circuit 47 includes a sequencer. When the PLP process is performed, the CPU 41 starts the data evacuating circuit 47 and the data evacuating circuit 47 evacuates data stored in the DRAM 6 to the NAND memory 5.

Here, the NAND memory 5 includes the evacuation areas. The evacuation area is a memory area to store data read from the DRAM 6 in the PLP process. The evacuation area is not selectable as a write area of data when the controller 4b performs write process in response to a write command from the host 2 or write process in a garbage collection.

In the PLP process, the started data evacuating circuit 47 determines the evacuating areas in the NAND memory 5 where the data in the DRAM 6 is to be stored by reference to an evacuation address list. The evacuation address list is a list that correlates addresses of the DRAM 6 and addresses of the NAND memory 5. The evacuation address list is stored in a RAM (not illustrated) of the controller 4b. The evacuation address list may be stored in the NAND memory 5 when applying of voltage to the memory system 1b is stopped. The evacuation address list may be read from the NAND memory 5 and stored in the RAM (not illustrated) of the controller 4b when starting the memory system 1b.

Figure 9:
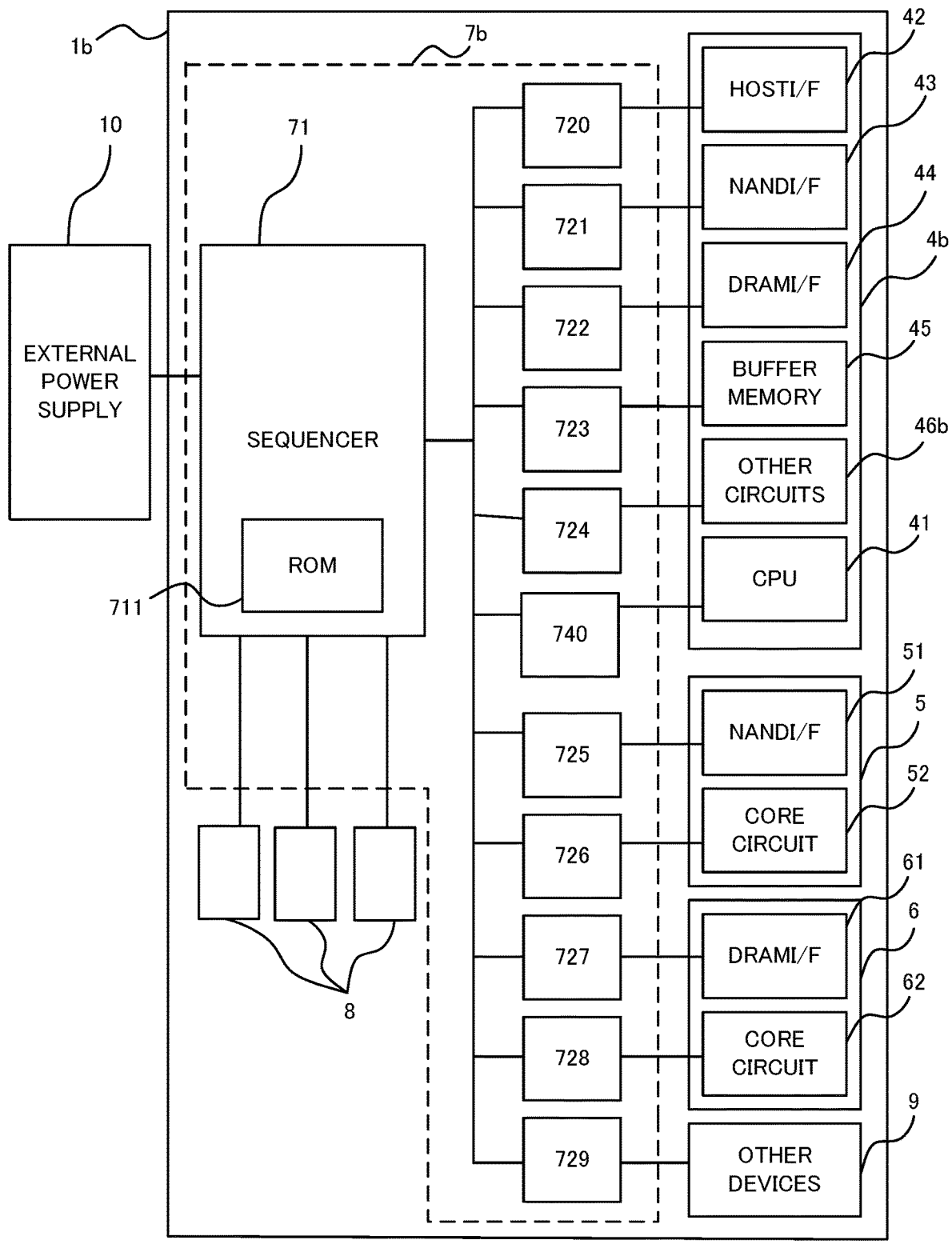
FIG. 9 is a block diagram illustrating a power supply configuration of the memory system according to the third embodiment.

FIG. 9 is a diagram illustrating a power configuration of the memory system 1b according to the third embodiment. The same reference numerals as those of the units of the memory system 1 according to the first embodiment are given to the units of the memory system 1b according to the third embodiment.

The memory system 1b includes the controller 4b, the NAND memory 5, a power control circuit 7b, the power storage devices 8, the other device 9, and the power circuits 720 to 729 and 740. The NAND memory 5, the other device 9, and the power circuits 720 to 729 among the elements of the memory system 1b are the same as those of the unit of the first embodiment and will not be described.

The power control circuit 7b includes the sequencer 71 and the plurality of the power circuits 720 to 729 and 740, the nonvolatile memory 711, and the voltage monitoring terminal (not illustrated). The nonvolatile memory 711 is, for example, a NOR flash memory.

The power circuit 740 is a converter that converts input voltages into other voltages. The power circuit 740 is, for example, a DC/DC converter or LDO regulator. It is noted that the power circuit 740 may be provided outside the power control circuit 7. In such a case, the power control circuit 7 and the power circuit 740 are connected via terminals.

The controller 4b includes the CPU 41, the host I/F 42, the NAND I/F 43, the DRAM I/F 44, the buffer memory 45, and other circuits 46b. The other circuits 46b include the data evacuating circuit 47 and a circuit that communicates with the power control circuit 7b. The CPU 41 is independently connected to the power control circuit 7, so that a voltage is separately applied or the application of the voltage is separately stopped by turning on and off the power circuit 740. The host I/F 42, the NAND I/F 43, the DRAM I/F 44, the buffer memory 45, and the other circuits 46b are independently connected to the power control circuit 7, so that a voltage is separately applied or the application of the voltage is separately stopped by turning on and off the power circuits 720 to 724.

Figure 10:
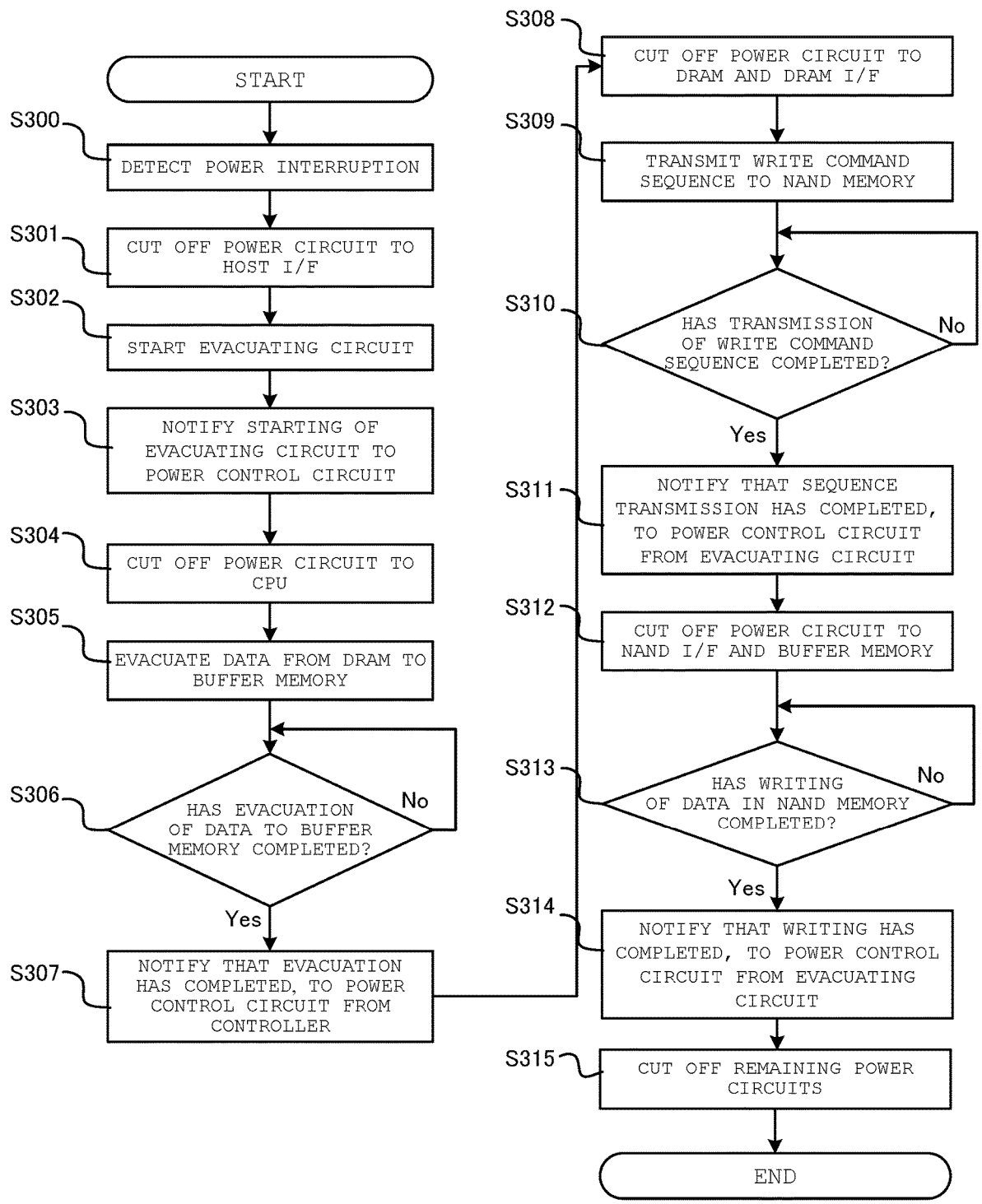
FIG. 10 is a flowchart illustrating power control in a power loss protection (PLP) process in the memory system according to the third embodiment.

FIG. 10 is a flowchart illustrating power control in a PLP process in the memory system according to the third embodiment. The PLP process in the memory system 1b according to the third embodiment will be described. Here, differences from the first embodiment will be described and description of common processes will not be described or will be simplified.

The power control circuit 7b detects interruption of power supplied from the external power supply 10 (S300), and the power control circuit 7b turns off the power circuit 720 and stops applying the voltage to the host I/F 42 (S301).

Next, the CPU 41 starts the data evacuating circuit 47 (S302). The CPU 41 notifies the power control circuit 7b that the starting of the data evacuating circuit 47 (S303). The power control circuit 7b turns off the power circuit 740 and stops applying the voltage to the CPU 41 (S304). Thus, the CPU 41 stops the operation.

Next, the data evacuating circuit 47 evacuates data from the DRAM 6 to the buffer memory 45 by reference to the evacuation address list (S305). This data includes data which is being written from the host 2 into the NAND memory 5. The data may include an LUT or system management information.

The data evacuating circuit 47 determines whether the evacuation of the data has completed (S306). When the evacuation of the data has not completed (No in S306), the process of the data evacuating circuit 47 returns to S306. When the evacuation of the data has completed (Yes in S306), the data evacuating circuit 47 notifies the power control circuit 7b that the evacuation of the data has completed (S307).

The power control circuit 7b which is notified of the completion turns off the power circuits 727 and 728 and stops applying the voltage to the DRAM I/F 61 and the core circuit 62 of the DRAM 6 (S308). Here, the power control circuit 7b also turns off the power circuit 722 and stops applying the voltage to the DRAM I/F 44 of the controller 4b. Thus, the DRAM 6 and the DRAM I/F 44 controlling the communication with the DRAM 6 stop the operation.

Next, the data evacuating circuit 47 transmits a write command sequence to the NAND memory 5 to write the data, which is in the buffer memory 45, into the NAND memory (S309). The write command sequence includes a write command and data to be written to the NAND memory 5. The write command is transmitted from the controller 4b to the NAND memory 5. The data to be written is transmitted from the buffer memory 45 to the NAND memory 5. An address included the write command sequence is determined by the data evacuating circuit 47 referencing to the evacuation address list.

Next, the data evacuating circuit 47 determines whether the transmission of the write command sequence has completed (S310). When the transmission of the write command sequence has not completed (No in S310), the process returns to S310. When the transmission of the write command sequence has completed (Yes in S310), the data evacuating circuit 47 notifies the power control circuit 7b that the transmission of the write command sequence has completed (S311).

The power control circuit 7b turns off the power circuits 721, 723, and 725 and stops applying the voltage to each of the NAND I/F 43 and the buffer memory 45 of the controller 4b and the NAND I/F 51 of the NAND memory 5 (S312). Thus, the NAND I/F 43 and the buffer memory 45 of the controller 4b and the NAND I/F 51 of the NAND memory 5 stop the operation.

The data evacuating circuit 47 determines whether the writing of the data into the NAND memory 5 has completed (S313). When the writing of the data has not completed (No in S313), the process of the data evacuating circuit 47 returns to S313. When the writing of the data has completed (Yes in S313), the data evacuating circuit 47 notifies the power control circuit 7b that the writing of data has completed (S314).

The power control circuit 7b turns off the remaining power circuits 724, 726, and 729 which are not turned off (S315). Thus, the other circuit 46b of the controller 4b, the core circuit of the NAND memory 5, and the other device 9 stop the operation. The memory system 1b ends the PLP process.

As described above, the memory system 1b according to the third embodiment further includes the data evacuating circuit 47. The data evacuating circuit 47 is a circuit operable to evacuate data. By the data evacuating circuit 47 evacuating data from the DRAM 6 to the NAND memory 5 in the PLP process, it is possible to stop supplying of power to the CPU 41 in the early stage of the PLP process. Therefore, it is possible to further reduce power consumption of the power in the PLP process. By reducing the power consumption in the PLP process, it is also possible to reduce the size of the power storage devices 8 to be mounted.

While certain embodiments have been described, the embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of controlling a memory system including a first memory that is a nonvolatile memory, a second memory that is a volatile memory, a third memory that is a volatile memory, and a power storage device, the method comprising:

while first power supplied from an external power supply is interrupted:
  performing control such that a second voltage based on second power supplied from the power storage device, is applied to the first memory and the second memory;
  writing data read from the second memory, to the third memory;
  reading the data from the third memory and transmitting the data to the first memory after the writing of the data to the third memory has completed;
  performing control such that the application of the second voltage to the second memory is stopped after the writing of the data to the third memory has completed and before writing of the data to the first memory has completed;
  performing control such that an application of the second voltage to the third memory is stopped after the reading of the data from the third memory has completed and before the writing of the data to the first memory has completed; and
  performing control such that the application of the second voltage to the first memory is stopped after the writing of the data to the first memory has completed.

2. The method according to claim 1, wherein the memory system further includes a controller and the method further comprises:
  performing control such that the application of the second voltage to the second memory is stopped after transmission of the data to the controller has completed.

3. The method according to claim 1, wherein the memory system further includes at least one power circuit, and the method further comprises:
  performing control such that the first voltage and the second voltage are applied to the first memory, and the at least one second memory through the power circuit.

4. The method according to claim 3, further comprising:
  controlling output of the first voltage or the second voltage from the at least one power circuit to be ON or OFF.

5. The method according to claim 3, wherein the at least one power circuit includes a plurality of power circuits and the memory system further includes a first circuit configured to communicate with a host, a second circuit configured to communicate with the first memory and a third circuit configured to communicate with the second memory, and the method further comprises:
  performing control such that the first voltage and the second voltage are applied to the first circuit, the second circuit, and the third circuit through at least one of the plurality of power circuits.

6. A memory system comprising:
  a first memory that is a nonvolatile memory;
  a second memory that is a volatile memory;
  a controller including a third memory that is a volatile memory;
  a power control circuit configured to perform control such that a first voltage is applied to the first memory, the second memory, and the controller based on first power supplied from at least an external power supply; and
  a power storage device configured to supply second power to the power control circuit while the first power from the external power supply is interrupted, wherein while the first power supplied from the external power supply is interrupted:
    the power control circuit performs control such that a second voltage based on the second power supplied from the power storage device is applied to the first memory, the second memory, and the controller;
    the controller reads data from the second memory and writes the data to the third memory;
    after the writing of the data to the third memory has completed, the controller reads the data from the third memory and transmits the data to the first memory;
    after the writing of the data to the third memory has completed and before writing of the data to the first memory has completed, the power control circuit performs control such that the application of the second voltage to the second memory is stopped;
    after the reading of the data from the third memory has completed and before the writing of the data to the first memory has completed, the power control circuit performs control such that the application of the second voltage to the third memory is stopped; and
    after the writing of the data to the first memory has completed, the power control circuit performs control such that the application of the second voltage to the first memory is stopped.

7. The memory system according to claim 6, wherein
  the controller transmits a first request to the power control circuit after the writing of the data to the third memory has completed and transmits a second request to the power control circuit after the writing of the data to the first memory has completed, and
  the power control circuit performs control such that the application of the second voltage to the second memory is stopped in response to the first request and such that the application of the second voltage to the first memory is stopped in response to the second request.

8. The memory system according to claim 6, wherein the power control circuit performs control such that the application of the second voltage to the second memory is stopped after transmission of the data to the controller has completed.

9. The memory system according to claim 6, further comprising:
  at least one power circuit, wherein the power control circuit performs control such that the first voltage and the second voltage are applied to the first memory, the second memory, and the controller through the at least one power circuit.

10. The memory system according to claim 9, wherein the power control circuit controls output of the first voltage or the second voltage from the at least one power circuit to be ON or OFF.

11. The memory system according to claim 9, wherein
  the at least one power circuit includes a plurality of power circuits,
  the controller includes a first circuit configured to communicate with a host, a second circuit configured to communicate with the first memory, and a third circuit configured to communicate with the second memory, and
  the power control circuit performs control such that the first voltage and the second voltage are applied to the first circuit, the second circuit, and the third circuit through at least one of the plurality of power circuits.

12. The memory system according to claim 11, wherein while the first power supplied from the external power supply is interrupted, the power control circuit performs control such that application of the second voltage to a power circuit corresponding to the third circuit and a power circuit corresponding to the second memory, is stopped after the data is copied from the second memory to the controller.

13. The memory system according to claim 11, wherein while the first power supplied from the external power supply is interrupted, the power control circuit performs control such that application of the second voltage is stopped according to the following sequence: a power circuit corresponding to the first circuit, then a power circuit corresponding to the third circuit, and then a power circuit corresponding to the second circuit.

14. The memory system according to claim 11, wherein
the first memory includes a fourth circuit configured to communicate with the controller, and
while the first power supplied from the external power supply is interrupted,
the controller issues a command to request the writing of the data to the first memory, and
the power control circuit performs control such that application of the second voltage to power circuits corresponding to the second and fourth circuits is stopped after the data is transmitted to the first memory and before the writing of the data to the first memory has completed.

15. The memory system according to claim 6, further comprising:
a fourth memory that is a volatile memory, wherein
while the first power supplied from the external power supply is interrupted,
the controller copies data from the fourth memory to the second memory, and
the power control circuit performs control such that application of the second voltage to the fourth memory is stopped after copying of the data has completed.

16. The memory system according to claim 6, wherein
the first voltage is an internal voltage of the memory system when the first power is supplied from the external power supply to the memory system, and
the second voltage is the internal voltage of the memory system when the first power from the external power supply is interrupted.

17. The memory system according to claim 6, wherein
the first memory includes an evacuation area,
the controller includes:
a processor configured to control the first memory and the second memory; and
a sixth circuit of which power consumption is less than power consumption of the processor, and
while the first power supplied from the external power supply is interrupted:
the processor starts the sixth circuit and transmits a notification that the sixth circuit has started to the power control circuit,
the power control circuit performs control such that application of the second voltage to the processor is stopped in response to the notification,
the sixth circuit reads the data from the second memory and transmits the data to the first memory, and
after writing of the data to the evacuation area of the first memory has completed, the power control circuit performs control such that application of the second voltage to the sixth circuit is stopped.

18. The memory system according to claim 17, wherein
the controller further includes a fourth memory that is a volatile memory,
the sixth circuit writes the data read from the second memory to the fourth memory,
the power control circuit performs control such that the application of the second voltage to the second memory is stopped after the writing of the data to the fourth memory has completed,
the sixth circuit reads the data from the fourth memory and transmits the data to the first memory, and
the power control circuit performs control such that application of the second voltage to a power circuit corresponding to the fourth memory is stopped after the data is transmitted to the first memory and before the writing of the data to the evacuation area of the first memory has completed.

19. The memory system according to claim 18, wherein
the sixth circuit transmits a first request to the power control circuit after the writing of the data to the fourth memory has completed and transmits a second request to the power control circuit after the writing of the data to the evacuation area of the first memory has completed, and
the power control circuit performs control such that the application of the second voltage to the second memory is stopped in response to the first request and such that the application of the second voltage to the first memory is stopped in response to the second request.

20. The memory system according to claim 17, wherein
the sixth circuit is configured to:
reference an address list that correlates a first address of the second memory and a second address of the evacuation area,
read the data from the second memory based on the first address in the address list, and
write the data to the evacuation area based on the second address in the address list.

* * * * *